(12) United States Patent
Kim (10) Patent No.: US 7,668,025 B2
(45) Date of Patent: Feb. 23, 2010

(54) INPUT CIRCUIT OF SEMICONDUCTOR MEMORY APPARATUS AND CONTROL METHOD OF THE SAME

(75) Inventor: Young-Ju Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 108 days.

(21) Appl. No.: 12/107,710

(22) Filed: Apr. 22, 2008

(65) Prior Publication Data

US 2009/0091985 A1 Apr. 9, 2009

(30) Foreign Application Priority Data

Oct. 4, 2007 (KR) ...................... 10-2007-0099989
Feb. 13, 2008 (KR) ...................... 10-2008-0012861

(51) Int. Cl.
*G11C 7/00* (2006.01)

(52) U.S. Cl. ...................................... 365/193; 365/201

(58) Field of Classification Search ......... 365/191–193, 365/201, 230.06, 233.1
See application file for complete search history.

(56) References Cited

U.S. PATENT DOCUMENTS

| 6,178,532 | B1 * | 1/2001 | Pierce et al. ................ 714/718 |
| 6,536,004 | B2 * | 3/2003 | Pierce et al. ................ 714/719 |
| 6,944,737 | B2 * | 9/2005 | Ahn et al. .................... 711/167 |
| RE38,956 | E * | 1/2006 | Beffa et al. ................. 365/201 |
| 7,224,625 | B2 | 5/2007 | Dietrich et al. |
| 7,502,267 | B2 * | 3/2009 | Lin et al. .................... 365/201 |
| 2005/0254307 | A1 | 11/2005 | Dietrich et al. |
| 2007/0109907 | A1 | 5/2007 | Dietrich |
| 2007/0234165 | A1 | 10/2007 | Chang et al. |

FOREIGN PATENT DOCUMENTS

| JP | 2006098103 | 4/2006 |
| KR | 1020060068187 | 6/2006 |
| KR | 1020070002806 | 1/2007 |

* cited by examiner

*Primary Examiner*—Gene N. Auduong
(74) *Attorney, Agent, or Firm*—Baker & McKenzie LLP (57) ABSTRACT

An input circuit of a semiconductor memory apparatus includes a first frequency control unit which receives a first signal and a second frequency control unit which receives a second signal. The first frequency control unit outputs the first signal to the second frequency control unit in response to a test mode signal and generates a third signal which has a frequency higher than the frequencies of the first and second signals by using the first and second signals. Also, the second frequency control unit outputs the second signal to the first frequency control unit in response to the test mode signal and generates a fourth signal which has a frequency higher than the frequencies of the first and second signals by using the first and second signals.

26 Claims, 7 Drawing Sheets

WDQS0

WDQS0_FC

WDQS1

WDQS1_FC

INPUT CIRCUIT OF SEMICONDUCTOR MEMORY APPARATUS AND CONTROL METHOD OF THE SAME

CROSS-REFERENCES TO RELATED APPLICATION

The present application claims priority under 35 U.S.C. 119(a) to Korean application number 10-2007-0099989, filed on Oct. 4, 2007, and Korean application number 10-2008-0012861, filed on Feb. 13, 2008, in the Korean Intellectual Property Office, which is incorporated by reference in its entirety as if set forth in full.

BACKGROUND

The embodiments described herein relate to a semiconductor memory apparatus and, more particularly, to an input circuit of a semiconductor memory apparatus and a method of controlling the input circuit.

Figure 1:
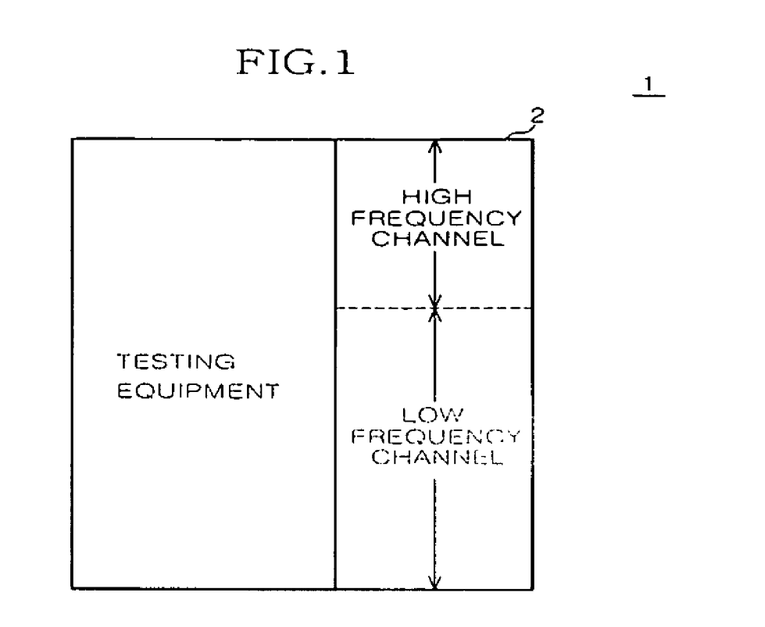
FIG. 1 is a block diagram illustrating a channel structure of an exemplary testing equipment.

As shown in FIG. 1, testing equipment 1 for testing semiconductor memory apparatus operates with a channel region 2, which is divided into a high frequency channel capable of supporting high frequency, and a low frequency channel.

Often there are fewer high frequency channels than low frequency channels in the testing equipment 1. However, the high frequency channels are needed to test most conventional high speed semiconductor memory apparatus. The distinction between the high frequency channel and the low frequency channel is not absolute but relative. Thus, the actual frequency can be different according to the testing equipment. For example, if the period of an output of a signal, which can be supported in the high frequency channel, is 1 ns, it can be 2 ns in the low frequency channel.

Figure 2:
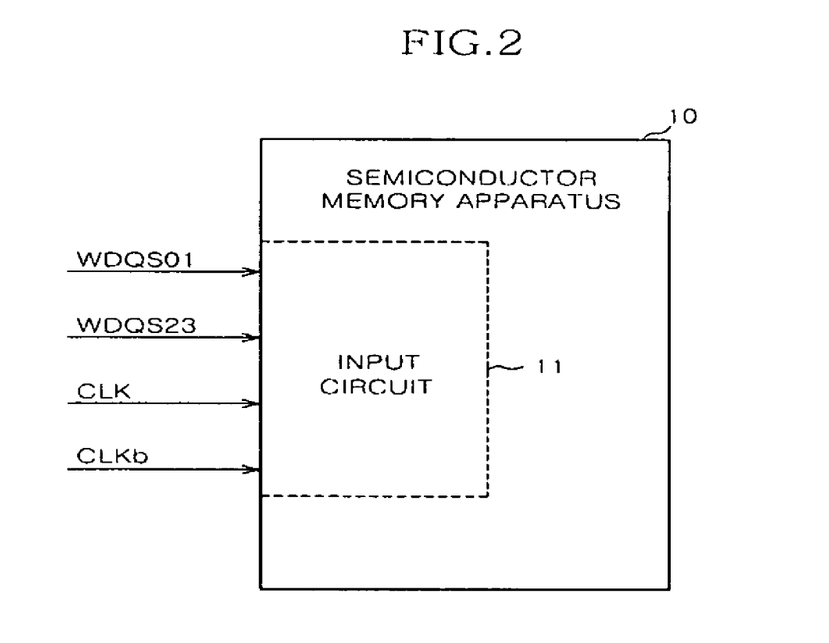
FIG. 2 is a block diagram illustrating an input circuit of an exemplary semiconductor memory apparatus.

As shown in FIG. 2, a conventional semiconductor memory apparatus 10 includes an input circuit 11 for receiving various signals, which are necessary for the operation of the semiconductor memory apparatus, through a buffer included therein. The signals necessary for the operation of the semiconductor memory apparatus can include data strobe signals 'WDQS01' and 'WDQS23' and clock signals 'CLK' and 'CLKb'.

Figure 3:
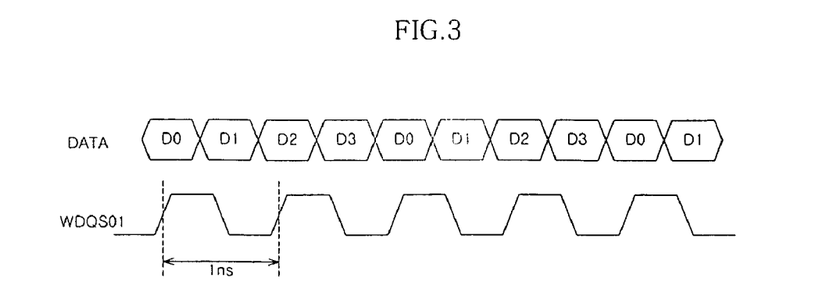
FIG. 3 is a wave form diagram illustrating a data strobe signal used by the semiconductor apparatus of FIG. 2.

In order to operate the semiconductor memory apparatus 10 at a high speed of more than 1 Ghz, the data strobe signals 'WDQS01' and 'WDQS23' should have a period of less than 1 ns, as shown in FIG. 3. Thus, the data strobe signals 'WDQS01' and 'WDQS23' and the clock signals 'CLK' and 'CLKb' are often input to input circuit 11 through the high frequency channels of the testing equipment 1. Thus, for example, if the number of the high frequency channels of the testing equipment 1 is 128 and four signals are required per semiconductor memory apparatus being tested, then the maximum number of semiconductor memory apparatus that can be tested at one time is limited to 32.

Therefore, the number of semiconductor memory apparatus which can be tested at one time is limited in accordance with the number of the high frequency channels included in the testing equipment 1, thereby lowering testing efficiency.

SUMMARY

An input circuit of a semiconductor memory apparatus, which makes it possible to test a high frequency operation through the low frequency channels of testing equipment, and a method of controlling the input circuit, are described herein.

According to an aspect, there is provided an input circuit of a semiconductor memory apparatus comprising a first frequency control unit that is configured to receive a first signal, and a second frequency control unit that is configured to receive a second signal, wherein the first frequency control unit is configured to output the first signal to the second frequency control unit in response to a test mode signal and generate a third signal that has a frequency higher than the frequencies of the first and second signals by using the first and second signals, and wherein the second frequency control unit is configured to output the second signal to the first frequency control unit in response to the test mode signal and generate a fourth signal that has a frequency higher than the frequencies of the first and second signals by using the first and second signals.

According to another aspect, there is provided a method of controlling an input circuit of a semiconductor memory apparatus, comprising the steps of determining whether a test mode signal is activated, and combining first and second signals when the test mode signal is activated to generate a third signal that has a frequency higher than the frequencies of the first and second signals.

Accordingly, testing efficiency can be improved since it is possible to achieve a high-frequency operating test through low-frequency channels of a testing equipment.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 4:
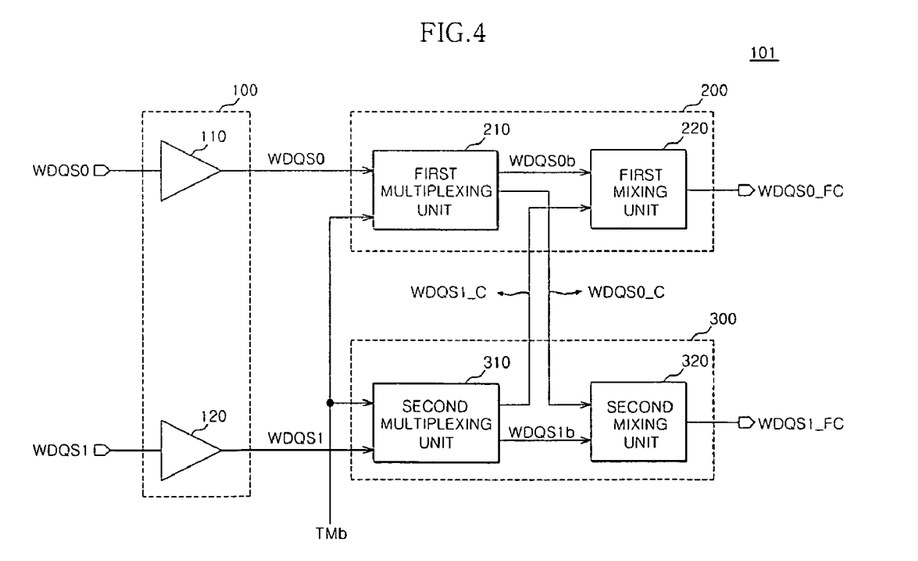
FIG. 4 is a block diagram illustrating an input circuit of a semiconductor memory apparatus according to one embodiment.

FIG. 4 is a diagram illustrating an example input circuit 101 that can be included in a semiconductor apparatus in accordance with one embodiment. As shown in FIG. 4, the input circuit 101 can include a buffer circuit unit 100, a first frequency control unit 200, and a second frequency control unit 300.

The buffer circuit unit 100 can include first and second buffers 110 and 120. The first buffer 110 can receive a first data strobe signal 'WDQS0' through a first low frequency channel of a plurality of low frequency channels in associated testing equipment. The second buffer 120 can receive a second data strobe signal 'WDQS1' through a second low frequency channel of the plurality of the low frequency channels.

Although there is a slight level difference between the signals outputted from the first and second buffers 110 and 120 and the signals input to the first and second buffers 110 and 120, the names of the signals output from the first and second buffers 110 and 120 are denoted identically to those of the signals input to the first and second buffers 110 and 120 because there is almost no change in their phase.

The first frequency control unit 200 can include a first multiplexing unit 210 and a first mixing unit 220. The second frequency control unit 300 can also include a second multiplexing unit 310 and a second mixing unit 320.

The first multiplexing unit 210 can be configured to modulate the phase of the first data strobe signal 'WDQS0' and then output a first phase modulated data strobe signal 'WDQS0b' to the first mixing unit 220. The first multiplexing unit 210 can be configured to modulate the phase of the first data strobe signal 'WDQS0' or fix the first data strobe signal 'WDQS0' to a predetermined level (for example, a high level) in response to a test mode signal 'TMb', thereby outputting a first multiplexed data strobe signal 'WDQS0_C' to the second mixing unit 320 in the second frequency control unit 300.

Similar to the first multiplexing unit 210, the second multiplexing unit 310 can be configured to modulate the phase of the second data strobe signal 'WDQS1' and then output a second phase modulated data strobe signal 'WDQS1b' to the second mixing unit 320. The second multiplexing unit 310 can be configured to modulate the phase of the second data strobe signal 'WDQS1' or fix the second data strobe signal 'WDQS1' to a predetermined level (for example, a high level) in response to the test mode signal 'TMb', thereby outputting a second multiplexed data strobe signal 'WDQS1_C' to the first mixing unit 220 in the first frequency control unit 200.

The first mixing unit 220 can be configured to mix the first phase modulated data strobe signal 'WDQS0b' and the second multiplexed data strobe signal 'WDQS1_C' to output a first frequency converted data strobe signal 'WDQS0_FC'. Also, the second mixing unit 320 can be configured to mix the second phase modulated data strobe signal 'WDQS1b' and the first multiplexed data strobe signal 'WDQS0_C' to output a second frequency converted data strobe signal 'WDQS1_FC'.

Figure 5:
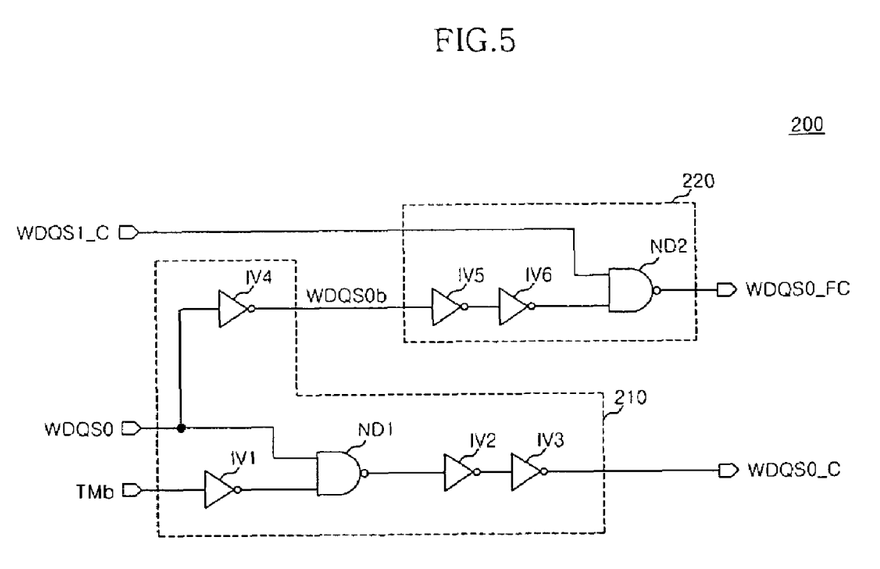
FIG. 5 is a circuit diagram illustrating a first frequency control unit that can be included in the apparatus of FIG. 4.

As shown in FIG. 5, the first multiplexing unit 210 can include first to fourth inverters IV1 to IV4 and a first NAND gate ND1. The first inverter IV1 can receive the test mode signal 'TMb'. The first NAND gate ND1 can receive the first data strobe signal 'WDQS0' and an output signal of the first inverter IV1. The second inverter IV2 can receive an output signal of the first NAND gate ND1. The third inverter IV3 can receive an output signal of the second inverter IV2. The fourth inverter IV4 can receive the first data strobe signal 'WDQS0'. The first multiplexed data strobe signal 'WDQS0_C' can be output from the third inverter IV3. The first phase modulated data strobe signal 'WDQS0b' can be output from the fourth inverter IV4.

The first mixing unit 220 can include fifth and sixth inverters IV5 and IV6 and a second NAND gate ND2. The fifth inverter IV5 can receive the first phase modulated data strobe signal 'WDQS0b'. The sixth inverter IV6 can receive an output signal of the fifth inverter IV5. The second NAND gate ND2 can receive the second multiplexed data strobe signal 'WDQS1_C' and an output signal of the sixth inverter IV6. The first frequency converted data strobe signal 'WDQS0_FC' can be output from the second NAND gate ND2.

Figure 6:
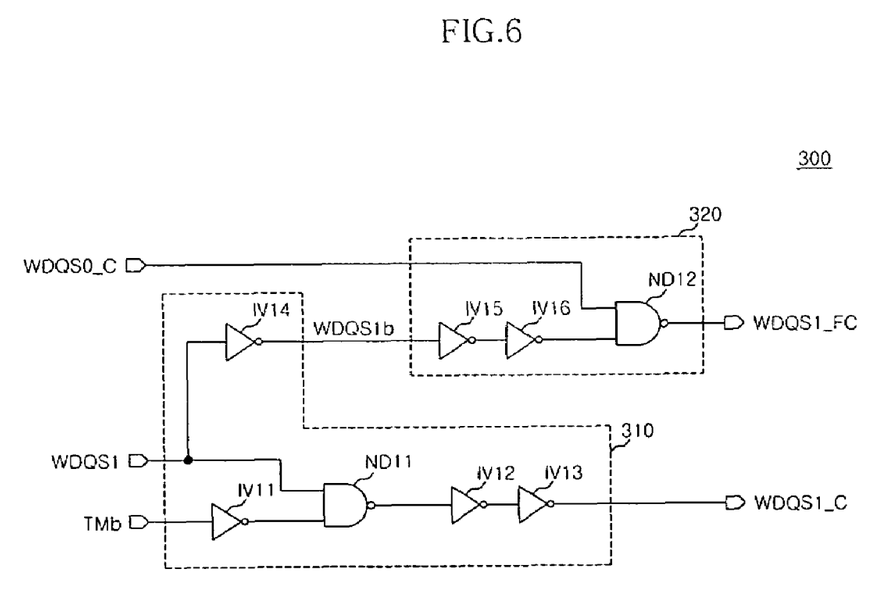
FIG. 6 is a circuit diagram illustrating a second frequency control unit that can be included in the apparatus of FIG. 4.

As shown in FIG. 6, the second multiplexing unit 310 can include seventh to tenth inverters IV11 to IV14 and a third NAND gate ND11. The seventh inverter IV11 can receive the test mode signal 'TMb'. The third NAND gate ND11 can receive the second data strobe signal 'WDQS1' and an output signal of the seventh inverter IV11. The eighth inverter IV12 can receive an output signal of the third NAND gate ND11. The ninth inverter IV13 can receive an output signal of the eighth inverter IV12. The tenth inverter IV14 can receive the second data strobe signal 'WDQS1'. The second multiplexed data strobe signal 'WDQS1_C' can be output from the ninth inverter IV13. The second phase modulated data strobe signal 'WDQS1b' can be output from the tenth inverter IV14.

The second mixing unit 320 can include eleventh and twelfth inverters IV15 and IV16 and a fourth NAND gate ND12. The eleventh inverter IV15 can receive the second phase modulated data strobe signal 'WDQS1b'. The twelfth inverter IV16 can receive an output signal of the eleventh inverter IV15. The fourth NAND gate ND12 can receive the first multiplexed data strobe signal 'WDQS0_C' and an output signal of the twelfth inverter IV16. The second frequency converted data strobe signal 'WDQS1_FC' can be output from the fourth NAND gate ND12.

The operation of the input circuit of a semiconductor memory apparatus according to the embodiments described above will be described below referring to FIG. 7.

With the entry of the test mode in a semiconductor memory apparatus, the first data strobe signal 'WDQS0' can be input to the first multiplexing unit 210 through the first buffer 110 of FIG. 4 via a first low frequency channel of the testing equipment. Also, the second data strobe signal 'WDQS1' can be input to the second multiplexing unit 310 through the second buffer 120 of FIG. 4 via a second low frequency channel of the testing equipment.

Figure 7:
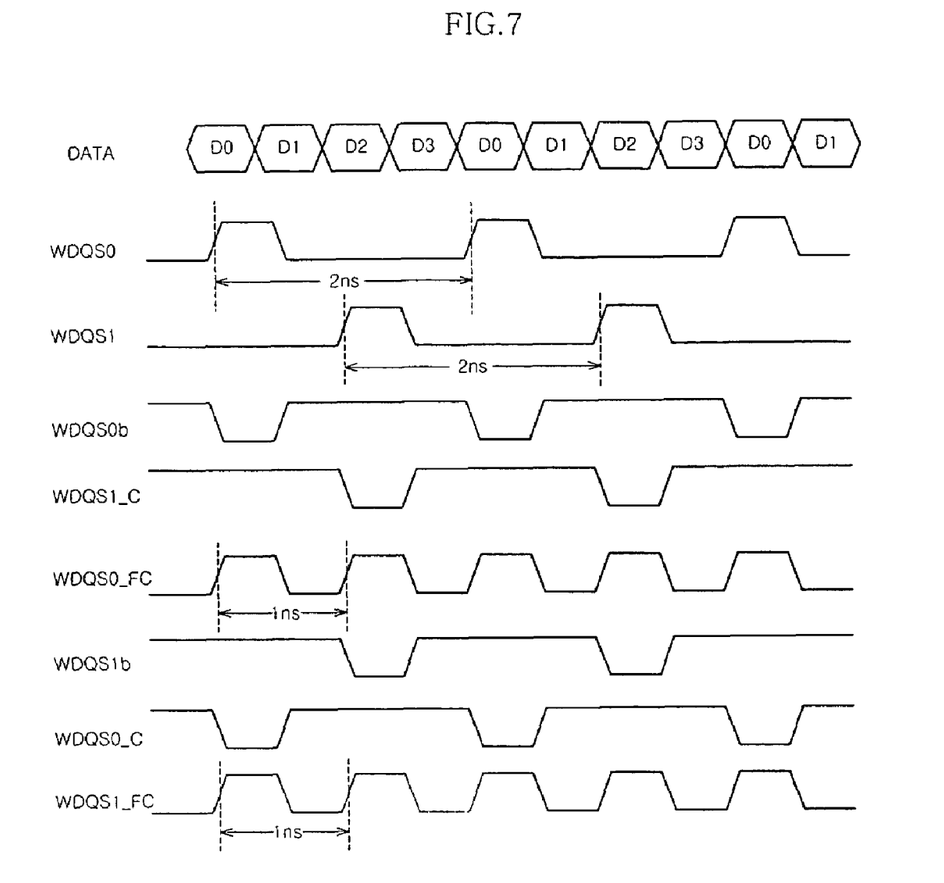
FIG. 7 is a wave form diagram illustrating the operation of the input circuit of the semiconductor memory apparatus of FIG. 4 according to one embodiment.

As shown in FIG. 7, each of the first and second data strobe signals 'WDQS0' and 'WDQS1' can have a different data strobe timing and a time period of low frequency (for example, 2 ns).

The test mode signal 'TMb' can be activated in a low level in the test mode of the semiconductor memory apparatus.

The first multiplexing unit 210 of the first frequency control unit 200 in FIG. 5 can be configured to modulate, namely, invert the phase of the first data strobe signal 'WDQS0' to output the first phase modulated data strobe signal 'WDQS0b' to the first mixing unit 220 through the fourth inverter IV4.

Also, since the test mode signal 'TMb' is activated at a low level, the first multiplexing unit 210 inverts the phase of the first data strobe signal 'WDQS0' to output the first multiplexed data strobe signal 'WDQS0_C' through the first NAND gate ND1 and the second and third inverters IV2 and IV3.

The first mixing unit 220 of FIG. 5 inverts the phase of the second multiplexed data strobe signal 'WDQS1_C' and outputs the first frequency converted data strobe signal 'WDQS0_FC', while the first phase modulated data strobe signal 'WDQS0b' is at a high level.

As shown in FIG. 7, the first frequency converted data strobe signal 'WDQS0_FC' can have a time period of a high frequency (for example, 1 ns), which is the same as that of a signal output from the high frequency channel of the testing equipment.

With the operation of the first frequency control unit 200, the second multiplexing unit 310 of the second frequency control unit 300 in FIG. 6 changes the phase of the second data strobe signal 'WDQS1' through the fourth inverter IV14. That is, the second phase modulated data strobe signal 'WDQS1b', which is out of phase with the second data strobe signal 'WDQS1', can be output to the second mixing unit 320.

Furthermore, since the test mode signal 'TMb' is activated at a low level, the second multiplexing unit 310 of FIG. 6 can change the phase of the second data strobe signal 'WDQS1' through the first NAND gate ND11 and the second and third inverters IV12 and IV13 and then output the second multiplexed data strobe signal 'WDQS1_C' to the second mixing unit 320.

While the second phase modulated data strobe signal 'WDQS1b' is maintained at a high level, the second mixing unit 320 of FIG. 6 changes the phase of the first multiplexed data strobe signal 'WDQS0_C', thereby outputting the second frequency converted data strobe signal 'WDQS1_FC'.

As shown in FIG. 7, the second frequency converted data strobe signal 'WDQS1_FC' has the same period as the signal output from the high-frequency channel of the testing equipment.

The first frequency converted data strobe signal 'WDQS0_FC' and the second frequency converted data strobe signal 'WDQS1_FC' can be combined in the semiconductor memory apparatus, which is positioned at the next stage of the input circuit illustrated in FIG. 4, in order that the combined signals can be used as internal data strobe signals.

Accordingly, in the embodiments described herein, the first data strobe signal 'WDQS0' of a low frequency (2 ns) input through the first low frequency channel of the testing equipment can be converted into the first frequency converted data strobe signal 'WDQS0_FC' with a high frequency (1 ns). Also, the second data strobe signal 'WDQS1' of a low frequency (2 ns) input through the second low frequency channel of the testing equipment can be converted into the second frequency converted data strobe signal 'WDQS1_FC' also with high frequency (1 ns).

Meanwhile, when the test mode of the semiconductor memory apparatus is terminated and a normal mode starts, the test mode signal 'TMb' is deactivated at a high level. Since the test mode signal 'TMb' is at a high level, the first multiplexing unit 210 of FIG. 5 and the second multiplexing unit 310 of FIG. 6 can maintain the voltage levels of the first multiplexed data strobe signal 'WDQS0_C' and the second multiplexed data strobe signal 'WDQS1_C' at a high level, respectively.

Since the second multiplexed data strobe signal 'WDQS1C' is at a high level, the first mixing unit 220 of FIG. 5 inverts the phase of the first phase modulated data strobe signal 'WDQS0b', thereby outputting the first frequency converted data strobe signal 'WDQS0_FC'. The first frequency converted data strobe signal 'WDQS0_FC', which is output in a state where the test mode signal 'TMb' is deactivated, has the same wave form and period as the first data strobe signal 'WDQS0'.

Since the first multiplexed data strobe signal 'WDQS0_C' is at a high level, the second mixing unit 320 of FIG. 6 inverts the phase of the second phase modulated data strobe signal 'WDQS1b', thereby outputting the second frequency converted data strobe signal 'WDQS1_FC'. The second frequency converted data strobe signal 'WDQS1_FC', which is output in a state in which the test mode signal 'TMb' is deactivated, has the same wave form and period as the second data strobe signal 'WDQS1'.

Although the embodiments described above are described in relation to a data strobe signal, the embodiments can be applied generally to generate a high frequency signal by combining low frequency signals that have different pulse generation timing. Therefore, signals having different pulse generation timing, i.e., clock signals 'CLK' and 'CLK/' can also be combined according to the apparatus and methods described herein.

Figure 8:
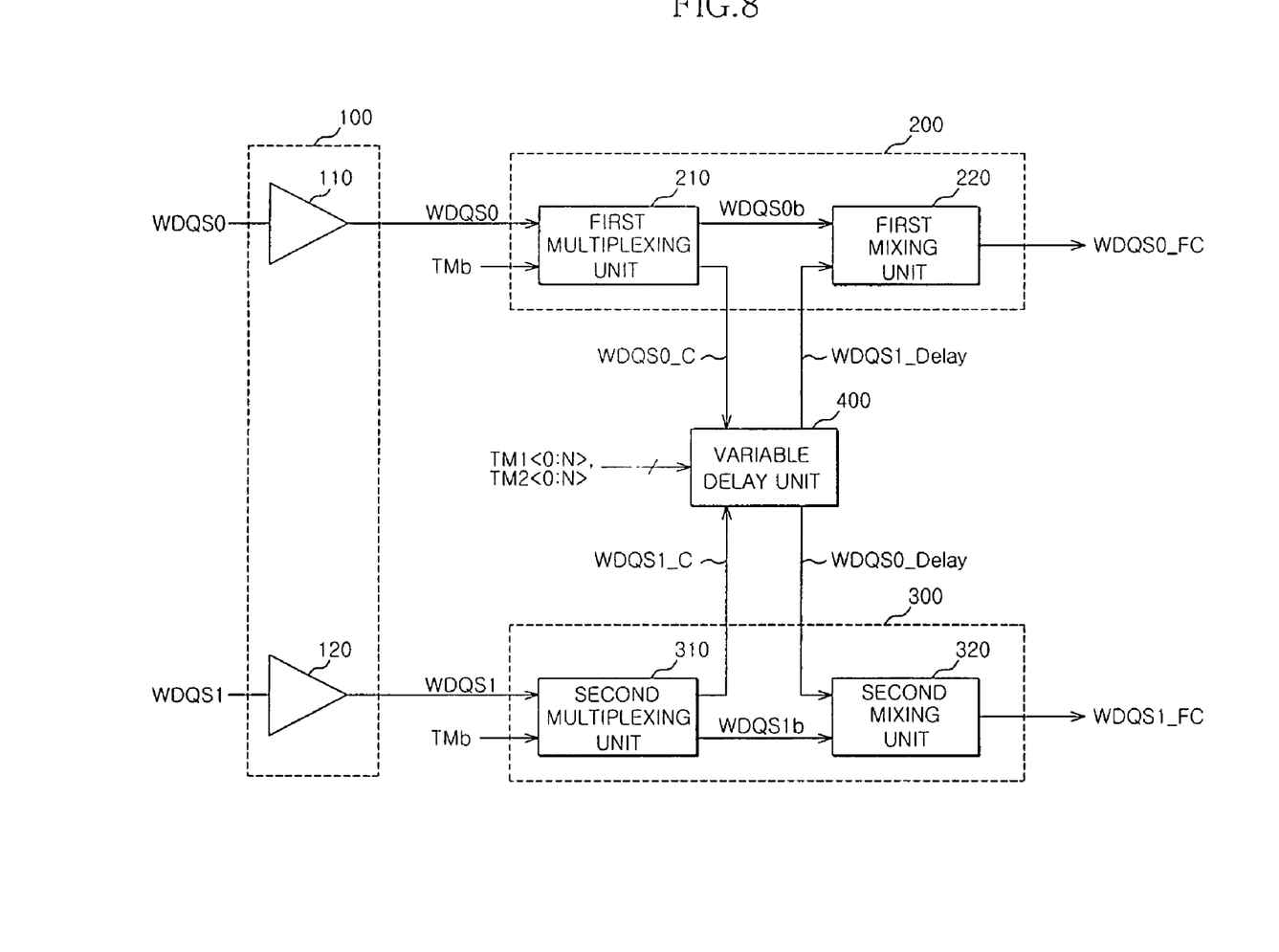
FIG. 8 is a block diagram illustrating an input circuit of a semiconductor memory apparatus according to another embodiment.

FIG. 8 is a block diagram illustrating an input circuit of a semiconductor memory apparatus according to another embodiment of the present invention. Elements designated with the same reference numerals in FIG. 8 are similar to the elements designated with that reference numeral in FIG. 4, and, therefore, are not described in detail herein.

The input circuit according to another embodiment of the present invention includes a buffer circuit unit 100, a first frequency control unit 200, a second frequency control unit 300 and a variable delay unit 400.

That is, the buffer circuit unit 100, the first frequency control unit 200 and the second frequency control unit 300 in FIG. 8 are the same as those in FIG. 4, except for the variable delay unit 400.

Figure 9:
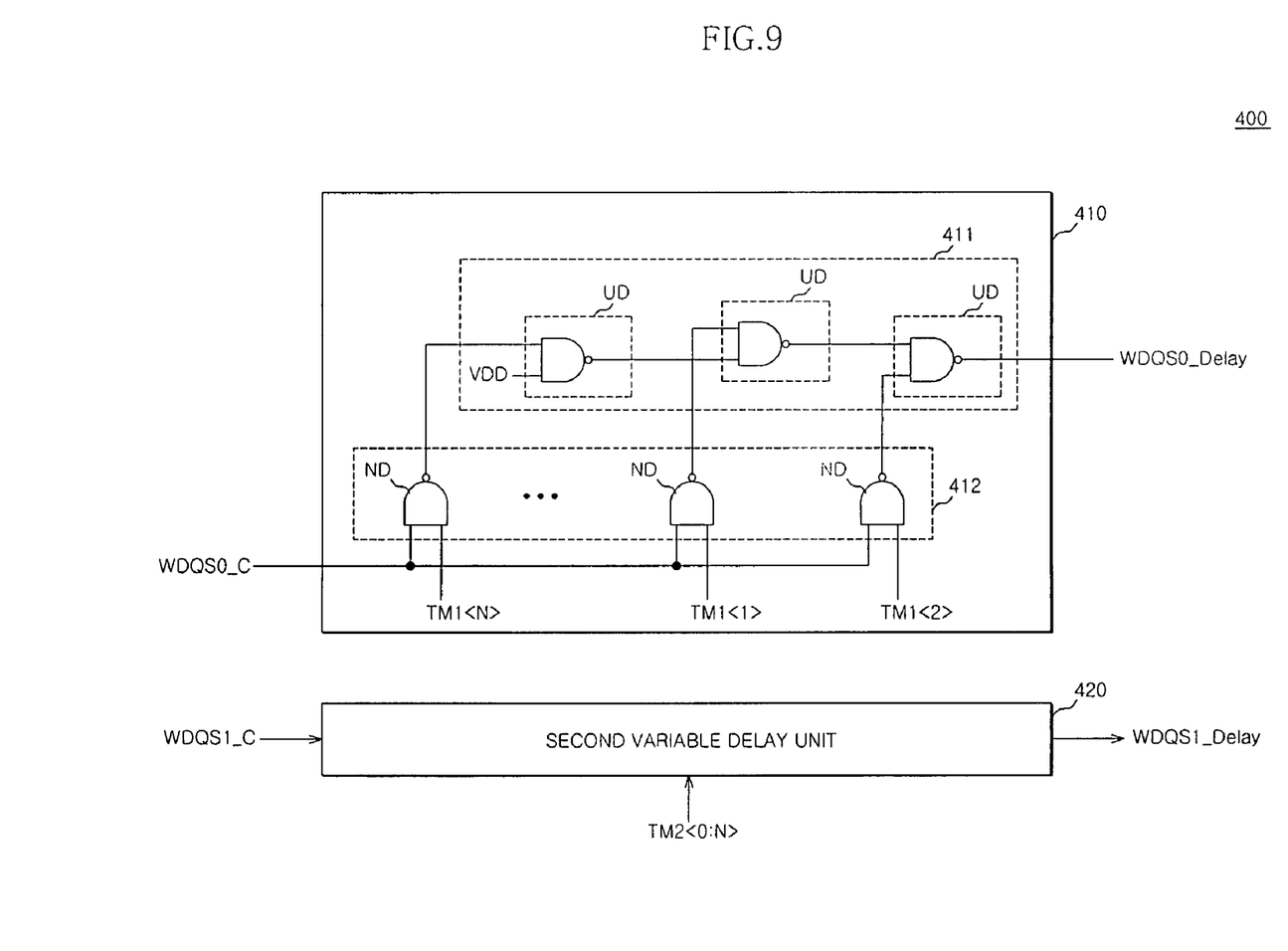
FIG. 9 is a circuit diagram illustrating a variable delay unit of FIG. 8.

FIG. 9 is a circuit diagram illustrating the variable delay unit 400 of FIG. 8.

As shown in FIG. 9, the variable delay unit 400 includes a first variable delay unit 410 and a second variable delay unit 420.

The first variable delay unit 410 is configured to delay a first multiplexed data strobe signal WDQS0_C for a first delay time which is set up by first delay test signals TM1<0:N>.

The second variable delay unit 420 is also configured to delay a second multiplexed data strobe signal WDQS1_C for a second delay time which is set up by second delay test signals TM2<0:N>.

The first and second delay times can be controlled separately based on the first delay test signals TM0<0:N> and the second delay test signals TM1<0:N>, respectively. Also, the first delay time can be the same as the second delay time, as occasion demands.

The first variable delay unit 410 includes a delay unit 411 and a delay control unit 420.

The delay unit 411 includes a plurality of unit delayers UD. The unit delayer UD can be made up of a NAND gate.

The delay control unit 412 determines the number of unit delayers UD which are to process the first multiplexed data strobe signal WDQS0_C in response to the first delay test signals TM1<0:N>. The delay control unit 412 includes a plurality of NAND gates ND. First input terminals of the NAND gates DN receive the first delay test signals TM1<0:N> on a bit-by-bit basis and second input terminals of the NAND gate DN commonly receive the first multiplexed data strobe signal WDQS0_C.

The second variable delay unit 420 has the same configuration as the first variable delay unit 410.

The variable delay unit 410 in FIG. 9 is exemplarily described, including the first variable delay unit 410 and the second variable delay unit 420. However, different embodiments can be achieved. For example, only one of the first variable delay unit 410 and the second variable delay unit 420 an be included an the variable delay unit 400 so that one of the first and second data strobe signals WDQS0 and WDQS1 is controlled in delay time.

Figure 10:
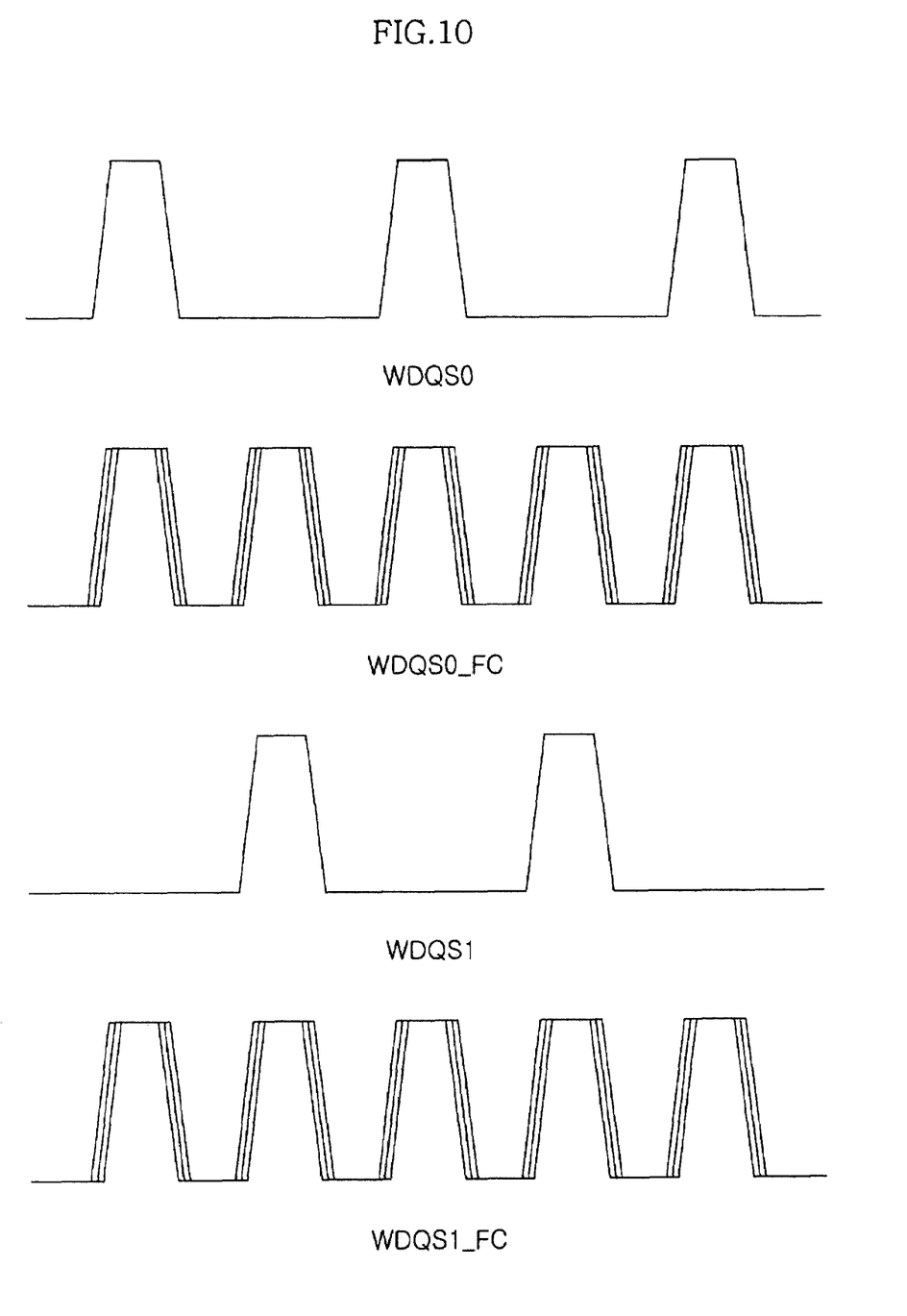
FIG. 10 is a wave form diagram of the input circuit of the semiconductor memory apparatus according to another embodiment.

The input circuit according to another embodiment of the present invention can individually control the delay times of the first and second multiplexed data strobe signals WDQS0_C and WDQS1_C according to the first and second delay test signals TM1<0:N> and TM2<0:N>. Accordingly, the duty and delay time of first and second frequency converted data strobe signal WDQS0_FC and WDQS1_FC can be controlled as shown in FIG. 10.

The input circuit of FIG. 8 is the same as that of FIG. 4 in the operation, except for the variable delay unit.

Although a data strobe signal is exemplarily illustrated in the present invention, different high frequency signals can be produced according to the present invention. For example, high frequency signals can be produced by combining low frequency signals in different pulse generation timings and the high frequency signals can be produced with a more exact duty and frequency through the delay control unit. Therefore, signals having different pulse generation timings, i.e., clock signals CLK and CLK/, are also applicable to the present invention.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An input circuit of a semiconductor memory apparatus, comprising:
   a first frequency control unit configured to receive a first signal; and
   a second frequency control unit configured to receive a second signal, wherein the first frequency control unit outputs the first signal to the second frequency control unit in response to a test mode signal and generates a third signal that has a frequency higher than the frequencies of the first and second signals by using the first and second signals, and wherein the second frequency control unit outputs the second signal to the first frequency control unit in response to the test mode signal and generates a fourth signal that has a frequency higher than the frequencies of the first and second signals by using the first and second signals.

2. The input circuit of claim 1, wherein the first and second signals include a data strobe signal or a clock signal.

3. The input circuit of claim 1, wherein the first frequency control unit includes:
   a multiplexing unit configured to output the first signal to the second frequency control unit in response to the test mode signal; and
   a mixing unit configured to combine the first and second signals to generate the third signal.

4. The input circuit of claim 3, wherein the multiplexing unit includes:
   a first logic circuit configured to modulate a phase of the first signal to output the first signal to the mixing unit; and
   a second logic circuit configured to modulate the phase of the first signal in order to output the first signal to the second frequency control unit when the test mode signal is activated.

5. The input circuit of claim 4, wherein the first logic circuit is configured to invert the phase of the first signal.

6. The input circuit of claim 4, wherein the second logic circuit includes:
   a first logic element configured to receive the test mode signal; and
   a second logic element configured to invert the phase of the first signal in response to an output signal of the first logic circuit and output an inverted signal of the first signal.

7. The input circuit of claim 4, wherein the mixing unit is configured to modulate the phase of the phase modulated first signal to output the third signal in response to the second signal.

8. The input circuit of claim 1, wherein the second frequency control unit includes:
   a multiplexing unit configured to output the second signal to the first frequency control unit in response to the test mode signal; and
   a mixing unit configured to combine the first and second signals to generate the fourth signal.

9. The input circuit of claim 8, wherein the multiplexing unit includes:
   a first logic circuit configured to modulate a phase of the second signal to output the second signal to the mixing unit; and
   a second logic circuit configured to modulate the phase of the second signal in order to output the second signal to the first frequency control unit when the test mode signal is activated.

10. The input circuit of claim 9, wherein the first logic circuit is configured to invert the phase of the second signal.

11. The input circuit of claim 9, wherein the second logic circuit includes:
    a first logic element configured to receive the test mode signal; and
    a second logic element configured to invert the phase of the second signal in response to an output signal of the first logic circuit and output an inverted signal of the second signal.

12. The input circuit of claim 9, wherein the mixing unit is configured to modulate the phase of the phase modulated second signal to output the fourth signal in response to the first signal.

13. The input circuit of claim 1, further comprising a buffer circuit unit configured to buffer the first signal output from a first low frequency channel and the second signal output from a second low frequency channel to input the first and second signals to the first and second frequency control units, respectively.

14. The input circuit of claim 1, wherein the first and second signals have different data strobe timings.

15. The input circuit of claim 1, further comprising a variable delay unit for individually delaying the first and second signals for delay times corresponding to delay test signals and then for outputting the delayed signals to the second and first frequency control units, respectively.

16. The input circuit method of claim 15, wherein the variable delay unit includes:
    a delay unit having a plurality of unit delayers; and
    a delay control unit for determining numbers of the unit delayers which are to pass through an input signal in response to the delay test signal.

17. An input circuit of a semiconductor memory apparatus which is tested by a testing equipment using a plurality of high and low frequency channels, the input circuit comprising:
    a first frequency control unit which receives a signal through a first channel of the plurality of the low frequency channels; and a second frequency control unit which receives a signal through a second channel of the plurality of the low frequency channels, wherein the first frequency control unit outputs the first signal to the second frequency control unit in response to a test mode signal and generates a third signal which has a frequency of the high frequency channel by using the first and second signals, and wherein the second frequency control unit outputs the second signal to the first frequency control unit in response to the test mode signal and generates a fourth signal which has a frequency of the high frequency channel by using the first and second signals.

18. The input circuit of claim 17, wherein the first and second signals include a data strobe signal or a clock signal.

19. The input circuit of claim 18, wherein the first frequency control unit includes:
   a multiplexing unit for outputting the first signal to the second frequency control unit in response to the test mode signal; and
   a mixing unit for combining the first and second signals to generate the third signal.

20. The input circuit of claim 18, wherein the second frequency control unit includes:
   a multiplexing unit for outputting the second signal to the first frequency control unit in response to the test mode signal; and
   a mixing unit for combining the first and second signals to generate the fourth signal.

21. The input circuit of claim 17, wherein the first and second signals have different data strobe timings.

22. The input circuit of claim 17, further comprising a variable delay unit for individually delaying the first and second signals for delay times corresponding to delay test signals and then for outputting the delayed signals to the second and first frequency control units, respectively.

23. The input circuit method of claim 22, wherein the variable delay unit includes:
   a delay unit having a plurality of unit delayers; and
   a delay control unit for determining numbers of the unit delayers which are to pass through an input signal in response to the delay test signal.

24. A method of controlling an input circuit of a semiconductor memory apparatus, comprising the steps of:
   determining whether a test mode signal is activated; and
   combining first and second signals when the test mode signal is activated to generate a third signal which has a frequency higher than the frequencies of the first and second signals.

25. The method of claim 24, wherein the first and second signals have different data strobe timings.

26. The method of claim 24, further comprising the step of outputting the first signal as the third signal when the test mode signal is inactivated.

* * * * *